US007676362B2

(12) United States Patent
Boillot et al.

(10) Patent No.: US 7,676,362 B2
(45) Date of Patent: Mar. 9, 2010

(54) METHOD AND APPARATUS FOR ENHANCING LOUDNESS OF A SPEECH SIGNAL

(75) Inventors: Marc A. Boillot, Plantation, FL (US); John G. Harris, Gainesville, FL (US)

(73) Assignee: Motorola, Inc., Schaumburg, IL (US)

( * ) Notice: Subject to any disclaimer, the term of this patent is extended or adjusted under 35 U.S.C. 154(b) by 1029 days.

(21) Appl. No.: 11/026,785

(22) Filed: Dec. 31, 2004

(65) Prior Publication Data

US 2006/0149532 A1 Jul. 6, 2006

(51) Int. Cl.
*G01L 11/04* (2006.01)
*G01L 19/06* (2006.01)
*G01L 21/02* (2006.01)
*H04R 1/20* (2006.01)
*H03G 5/00* (2006.01)

(52) U.S. Cl. ........................ 704/209; 704/205; 704/206

(58) Field of Classification Search ......... 704/200–203, 704/205–209, 211–230, 236–257; 381/97–109
See application file for complete search history.

(56) References Cited

U.S. PATENT DOCUMENTS 4,783,802 A 11/1988 Takebayashi et al.
4,941,178 A * 7/1990 Chuang ...................... 704/252
5,040,217 A 8/1991 Brandenburg et al.
5,175,769 A 12/1992 Hejna, Jr. et al.
5,313,555 A * 5/1994 Kamiya ...................... 704/233
5,341,457 A 8/1994 Hall, II et al.
5,459,813 A * 10/1995 Klayman .................... 704/209
5,611,002 A 3/1997 Vogten et al.
5,623,577 A 4/1997 Fielder
5,630,013 A 5/1997 Suzuki et al.
5,694,521 A 12/1997 Shlomot et al.
5,749,073 A 5/1998 Slaney
5,771,299 A * 6/1998 Melanson ................... 381/316
5,806,023 A 9/1998 Satyamurti
5,828,995 A 10/1998 Satyamurti et al.
5,842,172 A 11/1998 Wilson
5,920,840 A 7/1999 Satyamurti et al.
6,173,255 B1 1/2001 Wilson et al.
6,182,042 B1 * 1/2001 Peevers ...................... 704/269
6,292,776 B1 * 9/2001 Chengalvarayan .......... 704/219
6,507,820 B1 1/2003 Deutgen
6,539,355 B1 3/2003 Omori et al.
6,813,600 B1 11/2004 Casey, III et al.
6,879,955 B2 * 4/2005 Rao ........................... 704/241
6,889,182 B2 5/2005 Gustafsson
7,177,803 B2 2/2007 Boillot et al.
2001/0021904 A1 * 9/2001 Plumpe ...................... 704/209
2002/0065649 A1 * 5/2002 Kim ........................... 704/219
2004/0002856 A1 * 1/2004 Bhaskar et al. ............. 704/219

(Continued)

*Primary Examiner*—David R Hudspeth
*Assistant Examiner*—David Kovacek
(74) *Attorney, Agent, or Firm*—Scott M. Garrett; Larry G. Brown

(57) ABSTRACT

A speech filter (108) enhances the loudness of a speech signal by expanding the formant regions of the speech signal beyond a natural bandwidth of the formant regions. The energy level of the speech signal is maintained so that the filtered speech signal contains the same energy as the pre-filtered signal. By expanding the formant regions of the speech signal on a critical band scale corresponding to human hearing, the listener of the speech signal perceives it to be louder even though the signal contains the same energy.

15 Claims, 9 Drawing Sheets

U.S. PATENT DOCUMENTS

| | | | | |
|---|---|---|---|---|
| 2005/0249272 | A1* | 11/2005 | Kirkeby et al. | 375/232 |
| 2006/0036439 | A1* | 2/2006 | Haritaoglu et al. | 704/261 |
| 2007/0092089 | A1* | 4/2007 | Seefeldt et al. | 381/104 |
| 2007/0233472 | A1* | 10/2007 | Sinder et al. | 704/219 |
| 2008/0004869 | A1* | 1/2008 | Herre et al. | 704/211 |

* cited by examiner

1700

METHOD AND APPARATUS FOR ENHANCING LOUDNESS OF A SPEECH SIGNAL

CROSS REFERENCE

This application is related to U.S. patent application Ser. No. 10/277,407, titled "Method And Apparatus For Enhancing Loudness Of An Audio Signal," filed Oct. 22, 2002, which was a regular filing of provisional application having Ser. No. 60/343,741, titled "Method And Apparatus For Enhancing Loudness Of An Audio Signal," and filed Oct. 22, 2001. This application hereby claims priority to those applications.

TECHNICAL FIELD

This invention relates in general to speech processing, and more particularly to enhancing the perceived loudness of a speech signal without increasing the power of the signal.

BACKGROUND OF THE INVENTION

Communication devices such as cellular radiotelephone devices are in widespread and common use. These devices are portable, and powered by batteries. One key selling feature of these devices is their battery life, which is the amount of time they operate on their standard battery in normal use. Consequently, manufacturers of communication devices are constantly working to reduce the power demand of the device so as to prolong battery life.

Some communication devices operate at a high audio volume level, such as those providing loudspeaker capability for use as a speakerphone, or for walkie talkie or dispatch calling, for example. These devices can operate in either a conventional telephone mode, which has a low audio level for playing received audio signals in the earpiece of the device, provide a speakerphone mode, or a dispatch mode where a high volume speaker is used. The dispatch mode is similar to a two-way or so called walkie-talkie mode of communication, and is substantially simplex in nature. Of course, when operated in the dispatch mode, the power consumption of the audio circuitry is substantially more than when the device is operated in the telephone mode because of the difference in audio power in driving the high volume speaker versus the low volume speaker. Of course, it would be beneficial to have a means by which the loudness of a speech signal can be enhanced without increasing the audio power of the signal, so as to conserve battery power. Therefore there is a need to enhance the efficiency of providing high volume audio in these devices.

DETAILED DESCRIPTION

Figure 1:
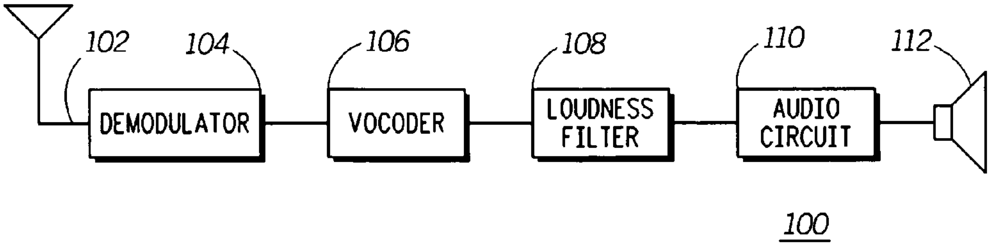
FIG. 1 shows a block diagram of a receiver portion of a mobile communication device, in accordance with one embodiment of the invention.

While the specification concludes with claims defining the features of the invention that are regarded as novel, it is believed that the invention will be better understood from a consideration of the following description in conjunction with the drawing figures, in which like reference numerals are carried forward.

It is well known in psychoacoustic science that the perception of loudness is dependent on critical band excitation in the human auditory system. The invention takes advantage of this psychoacoustic phenomena, and enhances the perceived loudness of speech without increasing the power of the audio signal. In one embodiment of the invention a warp filter is used to selectively expand the bandwidth of formant regions in voiced speech. The warped filter enhances the perception of speech loudness without adding signal energy by exploiting the critical band nature of the auditory system. The critical band concept in auditory theory states that when the energy in a critical band remains constant, loudness increases when a critical bandwidth is exceeded and an adjacent critical band is excited. The invention elevates the perceived loudness of clean speech by applying non-linear bandwidth expansion to the formant regions of vowels in accordance with the critical band scale. The resulting loudness filter can adjust vowel formant bandwidths on a critical band frequency scale in real-time. Vowels are known as voiced sounds given their periodicity due to the forceful vibration of air through the vocal chords. Vowels also predominately determine speech loudness, hence, the vowel regions of speech are precipitated for loudness enhancement using this bandwidth expansion technique. The invention provides a loudness filter, and is an adaptive post-filter and noise spectral shaping filter. It can thus be also used for perceptual weighting on a non-linear frequency scale. The filter response in one embodiment of the invention is modeled on the biological representation of loudness in the peripheral auditory system and the critical band concept of hearing.

The most dominant concept of auditory theory is the critical band. The critical band defines the processing channels of the auditory system on an absolute scale with the human representation of hearing. The critical band represents a constant physical distance along the basilar membrane of about 1.3 millimeters in length, and represent the signal processes within a single auditory nerve cell or fiber. Spectral components falling together in a critical band are processed together. Each critical band is an independent processing channels. Collectively they constitute the auditory representation of sound in hearing. The critical band has also been regarded as the bandwidth in which sudden perceptual changes are noticed. Critical bands were characterized by experiments of masking phenomena where the audibility of a tone over noise was found to be unaffected when the noise in the same critical band as the tone was increased in spectral width, but when it exceeded the spectral bounds of the critical band, the audibility of the tone was affected. Critical band bandwidth increases with increasing frequency. Furthermore, it has been found that when the frequency spectral content of a sound is increased so as to exceed the bounds of a critical band, the sound is perceived to be louder, even when the energy of the sound has not been increased. This is because the auditory processing of each critical band is independent, and their sum provides an evaluation of perceived loudness. By assigning each critical band a unit of loudness, it is possible to assess the loudness of a spectrum by summing the individual critical band units. The sum value represents the perceived loudness generated by a sound's spectral content. The loudness value of each critical band unit is a specific loudness, and the critical band units are referred to as Bark units. One Bark interval corresponds to a given critical band integration. There are approximately 24 Bark units along the basilar membrane. The critical band scale is a frequency-to-place transformation of the basilar membrane.

The critical band concept in auditory theory states that when the energy in a critical band remains constant, loudness increases when a critical band's spectral boundary is exceeded by the spectral content of the sound being heard. The principle observation of the critical band is that loudness does not increase until a critical band has been exceeded by the spectral content of a sound. The invention makes use of this phenomenon by expanding the bandwidth of certain peaks in a given portion of speech, while lowering the magnitude of those peaks. The invention applies this technique to the vowel regions of speech since vowels are known to contain the highest energy, are the longest in duration, are perceptually less sensitive in identification to changes in spectral bandwidth, and have a relatively smooth spectral envelope.

Referring now to FIG. 1, there is shown a block diagram of a receiver portion of a mobile communication device 100, in accordance with one embodiment of the invention. The receiver is an application of speech processing which may benefit from the invention. The receiver receives a radio frequency signal at an input 102 of a demodulator 104. As is known in the art, radio frequency signals are typically received by an antenna, and are then amplified and filtered before being applied to a demodulator. In the present example the signal being received contains vocoded voice information. The demodulator demodulates the radio frequency signal to obtain vocoded voice information, which is passed to a vocoder 106 to be decoded. The vocoder recreates a speech signal from the vocoded speech signal using linear predictive (LP) coefficients, as is known in the art. Vocoded speech is processed on a frame by frame basis, and with each frame there are typically several vocoder parameters such as, for example, a voicing value. The vocoder determines whether the present speech frame being processed is voiced, and the degree of voicing. According to an embodiment of the invention a spectral flatness measure may be used to indicate the voicing level if one is not provided in the vocoded signal. A high tonality and voicing value indicates the present speech frame is vowelic, and has substantial periodic components. The output of the vocoder is digitized speech, to which a post filter 108 is applied. In one embodiment of the invention the filter is applied selectively, depending on the amount of vowelic content of the speech frame being processed, as indicated by the vocoder voicing level or spectral flatness parameter. The filtered speech frame is then passed to an audio circuit 110 where it is played over a speaker 112.

The filter expands formant bandwidths in the speech signal by scaling the LP coefficients by a power series of r, given in equation 1 as:

$$A(z/\gamma)|_{y=1/r} = A(\ddot{z})|_{\ddot{z}=re^{jw}} = \sum_{k=0}^{p} (a_k r^{-k}) e^{-jwk}$$

Where:

A is the LPC transfer function z is the time domain Z transform

γ is the reciprocal of the evaluation radius $\ddot{z}$ is the time domain Z transform on the new evaluation radius r is the Z domain evaluation radius p is the LPC filter order k is each of the LPC coefficients; and a is the LPC coefficient for the kth term This technique is common to linear predictive speech coding and has been used as a compensation filter for problem of bandwidth underestimation and as a post filter to correct errors affecting the relative quality of vocoded speech as a result of quantization. Spectral shaping of equation 1 can be achieved using a filter according to equation 2:

$$H(z) = \frac{A(z/\alpha)}{A(z/\beta)}$$

Where:

H is the filter transfer function (frequency response)

α is the reciprocal numerator radius for γ in EQ1; and

β is the reciprocal denominator radius for γ in EQ1.

The filter provides a way to evaluate the Z transform on a circle with radius, r, greater than or less than the unit circle, r=1. For $0<\alpha<\beta<1$ the evaluation is on a circle closer to the poles and the net contribution of the poles has effectively increased, thus sharpening the pole resonance. For $0<\beta<\alpha<1$ (bandwidth expansion) the evaluation is on a circle farther away form the poles and thus the pole resonance peaks decrease and the pole bandwidths are widened. This filter technique of formant enhancement has been used to correct vocoder digitization errors, but not to expand the bandwidth any more than necessary to correct such errors. Correction for quantization effects in vocoder digitization processes involve sharpening formants, whereas, this invention involves broadening formants to expand their bandwidth to elevate perceived loudness. Hence, formant sharpening filters use α<β, whereas the formant broadening filters of this invention uses β<α. Formant enhancement sharpens and narrows peaks in an attempt to increase the signal to noise ratio thereby increasing the intelligibility of speech. However, according to the invention, formant bandwidths may be expanded to a degree that enhances the perception of loudness without significantly reducing intelligibility for vocoded and non-vocoded speech.

Figure 2:
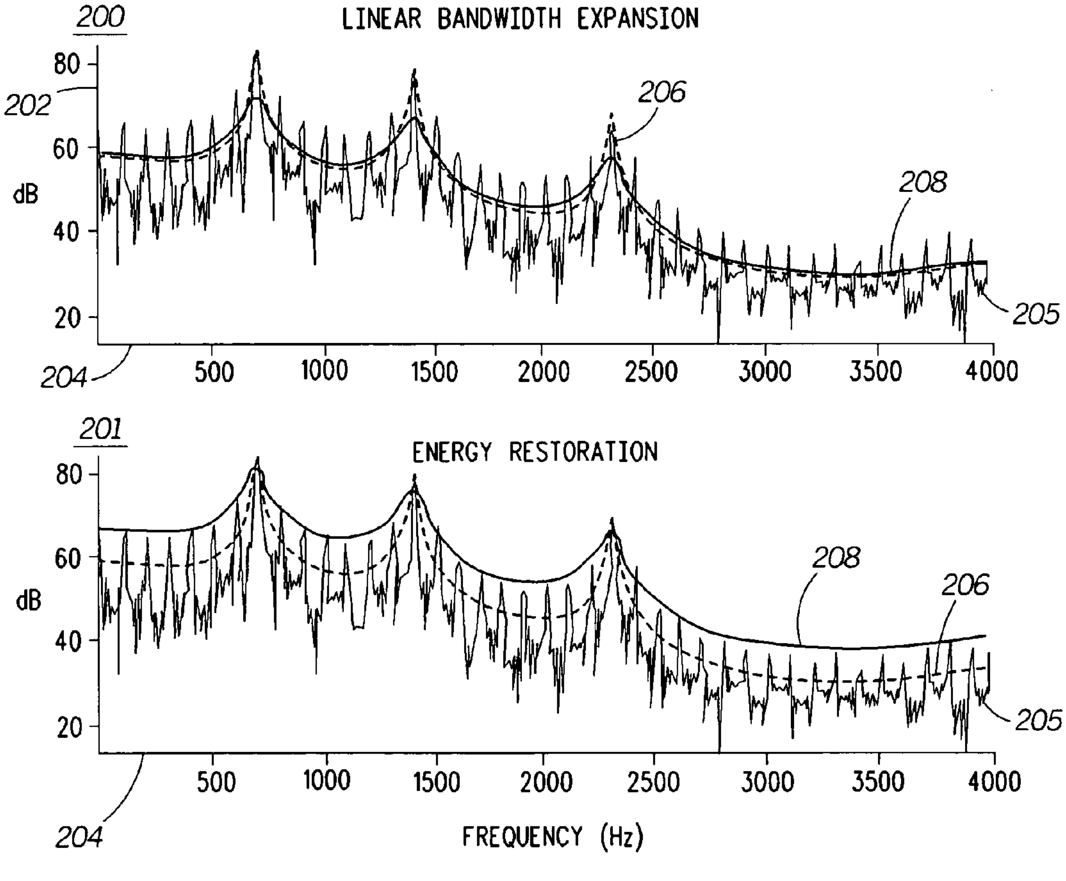
FIG. 2 shows a graph chart in the frequency domain of a vowelic speech signal and a resulting speech signal when filtered in accordance with the invention.

The effect of a filter which operates in accordance with the invention is illustrated in FIG. 2, which shows a pair of graphs 200, 201 in the frequency domain of a vowelic speech signal. The graphs show magnitude 202 versus frequency 204. Each graph shows a fast fourier transform 205 of a segment of a speech signal. The dotted line 206 represents the frequency envelope of the unfiltered speech signal. The peaks in the envelope represent formants, which are periodic, and the immediate area around the peaks are formant regions. Upon application of the loudness filter 108, the formant bandwidths are expanded, as represented by the solid line 208. The original speech energy is restored as shown in 201 with the solid line 208 by effectively elevating the bandwidth expanded signal. Thus, the invention increases loudness without increasing the energy of the speech signal by expanding the bandwidth of formants in a speech signal. The technique may be applied on a real time basis (frame by frame). To restore the energy level of the filtered signal, the energy of the unfiltered signal 206 is determined, and upon application of the loudness filter, the energy lost in the peak regions of the formants is added back to the filtered signal by shifting the entire filtered signal up until the filtered signal's energy is equal to the unfiltered signal's energy.

Figure 3:
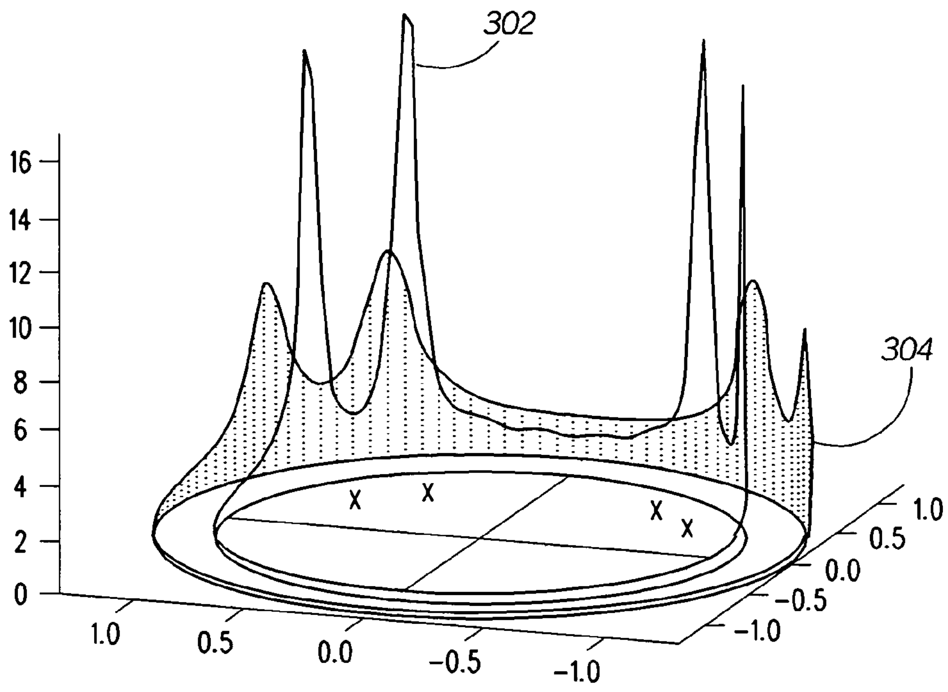
FIG. 3 shows a graphical representation of unfiltered speech and filtered speech in the z Domain, where the filtered speech is filtered in accordance with the invention.

Referring now to FIG. 3, there is shown another graphical representation 300 of unfiltered speech 302 and filtered speech 304 which has been filtered in accordance with the invention in z plane plot. The filtered speech 304 uses the filter equation shown with α=1 and β<1. If the poles are well separated, as in the case of formants, then the bandwidth change ∇B of a complex pole can be related to the radius r at a sampling frequency $f_s$ by, equation 3:

$$\nabla B = ln(r) f_s / \pi (\text{Hz})$$

This follows from an s-plane result that the bandwidth of a pole in radians/second is equal to twice the distance of the pole from the jw-axis when the pole is isolated from other poles and zeros.

In an exemplary embodiment, we used $10^{th}$ order LP coefficient analysis with a variable bandwidth expansion factor as a function of the voicing level (tonality), 32 millisecond frame size, 50% frame overlap, and per frame energy normalization. Durbin's method with a Hamming window was used for the autocorrelation LP coefficient analysis. All speech examples were bandlimited between 100 Hz and 16 KHz. Each frame was passed through a filter implementing equation 1, given hereinabove with β=0.4, α adjusted between 0.4<α<0.85 as a function of tonality, and reconstructed with the overlap and add method of Hamming windows. The bandwidth has been expanded for loudness enhancement to the point at which a change in intelligibility is noticeable but still acceptable.

As previously noted, formant sharpening is a known technique applied to reduce quantization errors by concentrating the formant energy in the high resonance peaks. Human hearing extrapolates from high energy regions to low energy regions, hence formant sharpening effectively places more energy in the formant peaks to distract attention away from the low energy valleys where quantization effects are more perceivable. Sophisticated quantization routines allow for more quantization errors in the high energy formant regions instead of the valleys to exploit this hearing phenomena. This invention, however, applies bandwidth expansion of formants to increase loudness on speech for which the effects of quantization are already minimal in the formant valley regions. Correction for quantization effects in vocoder digitization processes involve sharpening formants, whereas, this invention involves broadening formants to expand their bandwidth to elevate perceived loudness. Hence, formant sharpening filters use α<β, whereas the formant broadening filters of this invention uses β<α.

Figure 4:
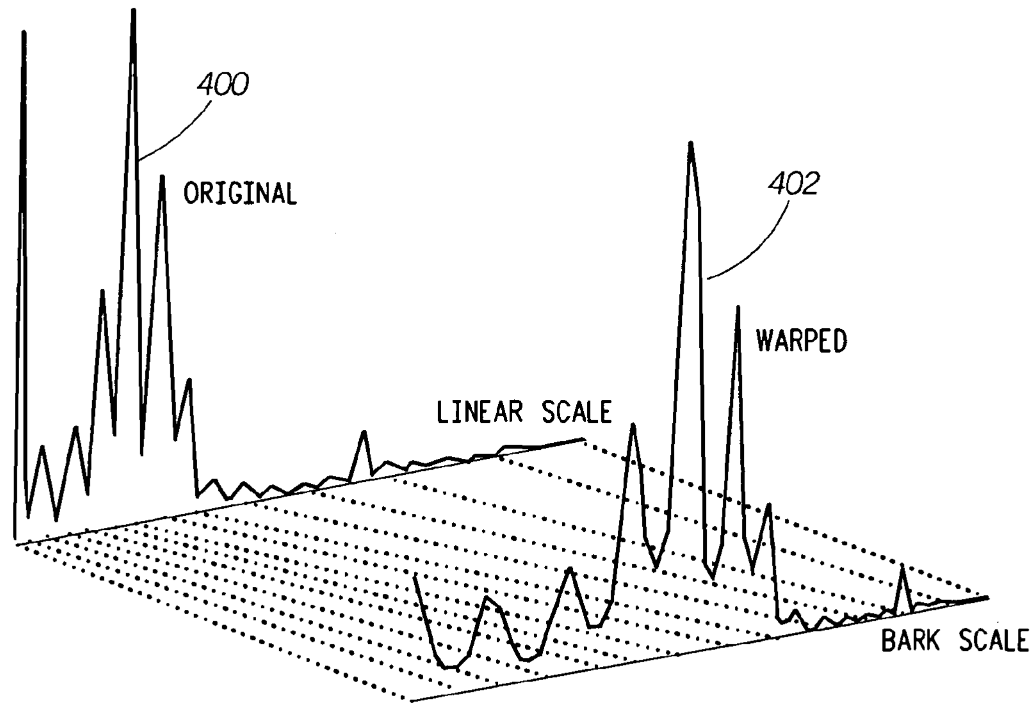
FIG. 4 shows a mapping of a speech signal spectrum from a linear scale to a Bark scale, in accordance with one embodiment of the invention.

In one embodiment of the invention, to further enhance the filter design, a non-linear filtering technique is used in the filter to warp the speech from a linear frequency scale to a Bark scale so as to expand the bandwidths of each pole on a critical band scale closer to that of the human auditory system. FIG. 4 shows an example of a mapping of a speech signal spectrum from a linear scale 400 to a Bark scale 402. Warped linear prediction uses allpass filters in the form of, equation 4:

$$\tilde{z}^{-1} = \frac{z^{-1} - \alpha}{1 - \alpha z^{-1}}$$

An allpass factor of α=0.47 provides a critical band warping. The transformation is a one-to-one mapping of the z domain and can be done recursively using the Oppenheim recursion. FIG. 4 shows the result of an Oppenheim recursion with α=0.47. The recursion can be applied to the autocorrelation sequence $R_n$, power spectrum $P_n$, prediction parameters $a_p$, or cepstral parameters. We used the Oppenheim recursion on the autocorrelation sequence for the frequency warping transformation.

The warped prediction coefficients $\tilde{a}_k$ define the prediction error analysis filter given by, equation 5:

$$\tilde{A}(z) = 1 - \sum_{k=1}^{p} \tilde{a}_k z^{-k}(z)$$

and can be directly implemented as a finite impulse response (FIR) filter with each unit delay being replaced by an all-pass filter. However, the inverse infinite impulse response (IIR) filter is not a straightforward unit delay replacement. The substitution of allpasses into the unit delay of the recursive IIR form creates a lag-free term in the delay feedback loop. The lag-free term must be incorporated into a delay structure which lags all terms equally to be realizable. Realizable warped recursive filter designs to mediate this problem are known. One method for realization of the warped IIR form requires the all-pass sections to be replaced with first order low-pass elements. The filter structure will be stable if the warping is moderate and the filter order is low. The error analysis filter equation given above in equation 5 can be expressed as a polynomial in $z^{-1}/(1-\alpha z^{-1})$ to map the prediction coefficients to a coefficient set used directly in a standard recursive filter structure. In this manner the allpass lag-free element is removed from the open loop gain and realizable warped IIR filter is possible.

The $b_k$ coefficients are generated by a linear by a linear transform of the warped LP coefficients, using binomial equations or recursively. The bandwidth expansion technique can be incorporated into the warped filter and are found from equation 6:

$$b_k = \sum_{n=k}^{p} C_{kn}\tilde{a}_n$$

$$C_{kn} = \binom{n}{k}(1-\alpha^2)^k(-\alpha)^{n-k}r^{-n}$$

The $b_k$ coefficients are the bandwidth expanded terms in the IIR structure.

Figure 5:
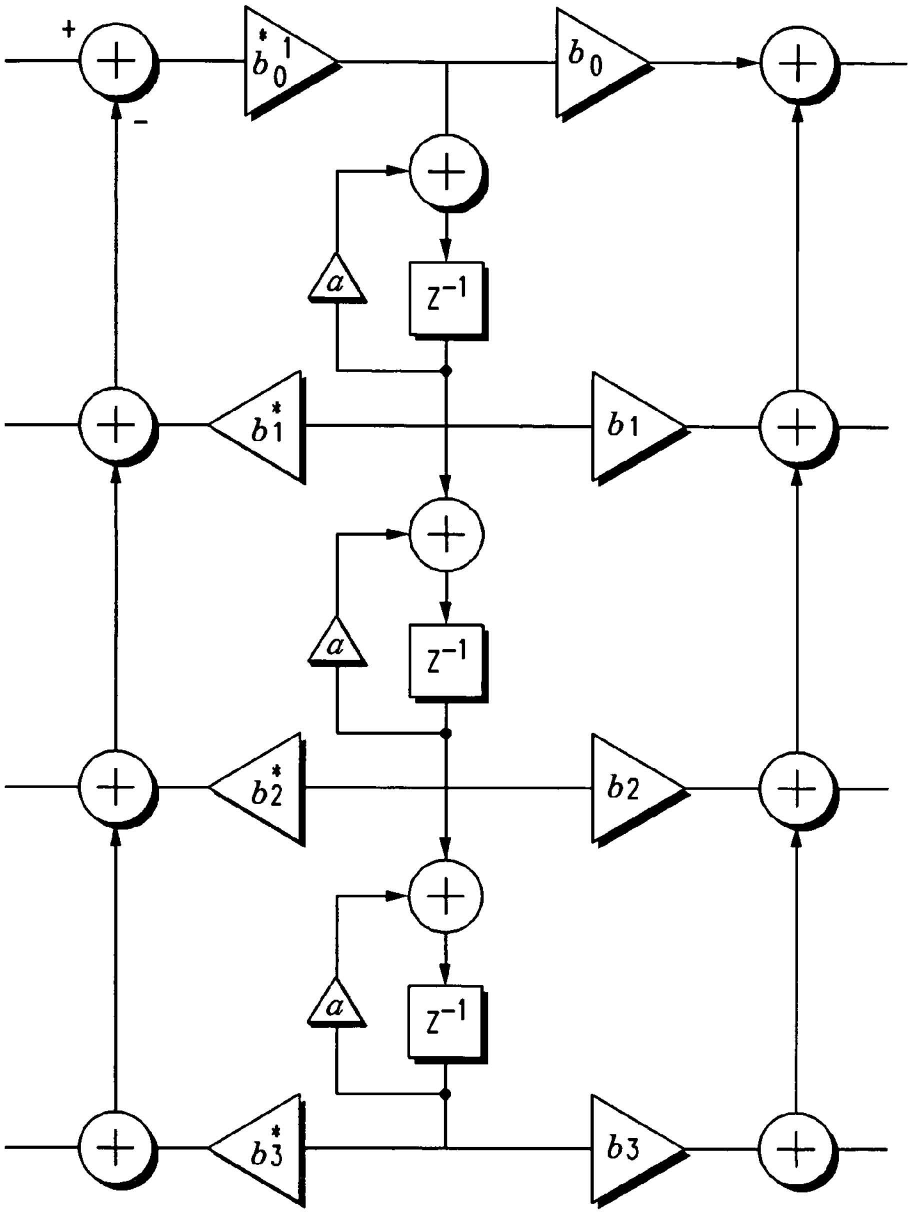
FIG. 5 shows a canonic form of an $N^{th}$ order warped LP coefficient filter, in accordance with one embodiment of the invention.

Referring now to FIG. 5, there is shown a canonic form of an $N^{th}$ order warped LP coefficient (WLPC) filter, in accordance with one embodiment of the invention. The WLPC filter can be put in the same form as a general vocoder post filter, and is represented by, equation 7:

$$H(z) = \frac{B(\tilde{z})}{B(\tilde{z}/\gamma_d)}$$

Where:

$\tilde{z}$ is the warped z plane.

$\gamma_d$ is the reciprocal of the evaluation radius in the warped domain, $\gamma_d = 1/\tilde{r}$ The transfer function represents the $b_k$ terms previously calculated from the binomial recursions. The $\gamma$ term describes the effective evaluation radius which determines the level of formant sharpening or broadening. The $\gamma$ term is included with the $\tilde{z}$ term to illustrate how it alters the projection space (evaluation radius) of the filter in the $\tilde{z}$ domain. Speech processed with this filter will generate formant sharpened or formant broadened speech. The filter can be considered to process speech in two stages. The first stage passes the speech through the filter numerator which generates the residual excitation signal. The second stage passes the speech through the inverse filter (the denominator) which includes the formant adjustment term. The speech can be broadened on a linear or non-linear scale depending on how the warping factor is set. Without warping, the transfer function reduces to the general LPC postfilter which allows only for linear formant bandwidth adjustment. The warped filter effectively expands higher frequency formants by more than it expands lower frequency formants. The warped bandwidth expansion filter can also be put in the general form, for which the bandwidth expansion term is incorporated within the warped filter coefficient calculations, equation 8:

$$H(z) = \frac{B(\tilde{z}/\gamma_n)}{B(\tilde{z}/\gamma_d)}$$

Equation 8 describes a filter that can be used for either formant sharpening or formant expansion on a linear or warped (non-linear) frequency scale. The warping factor is inherently included in the gamma terms. This filter form is used in practice over the previous form because it does not require a complete resynthesis of the speech. Equation 7 employs a numerator that completely reduced the speech signal to a residual signal before being convolved with the denominator. Equation 8 employs a numerator which produces a partial residual signal before being convolved with the denominator. The latter form is advantageous in that the filter better preserves the formant structure for its intended use with minimal artifacts. The warping factor, $\alpha$, sets the frequency scale and is seen as the locally recurrent feedback loop around the $z^{-1}$ unit delay elements. When the warping factor $\alpha=0$, the filter does not provide frequency warping and reduces to the standard (linear) postfilter. When the warping factor $\alpha=-0.47$, the filter is a warped post filter that provides formant sharpening and formant expansion on the critical band scale. Formant adjustment on the critical band scale is more characteristic of human speech production. Physical changes of the human vocal tract also produce speech changes on a critical band scale. The warped filter results in artificial speech adjustment in accordance with a frequency resolution scale that approximates human speech processing and perception. FIG. 5 shows the two processing stages of the filter in Equation 8. The numerator $B(\tilde{z}/\gamma_n)$ represents the FIR stage and is seen as the feedforward half (on the right) of the illustration. The denominator $1/[B(\tilde{z}/\gamma_d)]$ represents the IIR stage and is seen as the feedback half (on the left) of the illustration. The $b_k$ terms were previously determined using the binomial equations with inclusion of the evaluation radius term. FIG. 5 is a direct realization of the warped filter of equation 8 with the formant evaluation radius effect accounted for in the $b_k$ coefficients.

High Level Design

This section details the description of a warped filter designed in accordance with an embodiment of the invention which enhances the perception of speech loudness without adding signal energy. It adjusts formant bandwidths on a critical band scale, and uses a warped filter for speech enhancement. The underlying technique is a non-linear application of the linear bandwidth broadening technique used for speech modeling in speech recognition, perceptual noise weighting, and vocoder post-filter designs. It is a pole-displacement model, which is a computationally efficient technique, and is included in the linear transformation of the warped filter coefficients. The inclusion of a warped pole displacement model for nonlinear bandwidth expansion in the filter was motivated from the critical band concept of hearing.

Figure 6:
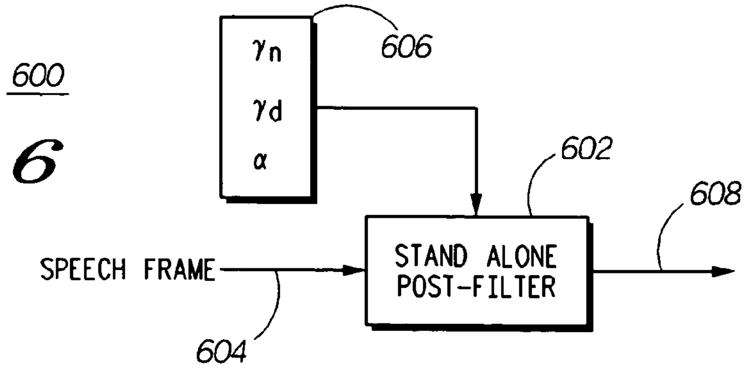
FIG. 6 shows a speech processing algorithm 600, in accordance with an embodiment of the invention.

FIG. 6 shows a block diagram representation of a speech processing algorithm 600, in accordance with an embodiment of the invention. The post filter algorithm 602 requires a frame (fixed, contiguous quantity) of sampled speech 604 and a set of filter parameters 606 such as $\gamma n$, $\gamma d$, and $\alpha$ as described hereinabove in equation 8. The algorithm has the effect of filtering speech, and expanding formants in the speech. The speech frames may be received from, for example, the receiver of a mobile communication device. The algorithm operates on a frame-by-frame basis processing each new frame of speech as it is received. The number of samples which define a frame (called frame length) will be of fixed length, although, the length can be variable. A list of parameters 606 is provided to set the amount of non-linear bandwidth expansion ($\gamma_d$, $\gamma_n$) and the frequency scale ($\alpha$). These parameters can be varied on a per frame basis as needed, based, for example, on a particular desired loudness setting or in response to the content of the speech frame being processed. In one embodiment of the invention the bandwidth expansion parameters are adjusted as a function of the speech tonality as in the case of selectively applying formant expansion to vowel regions of speech. In one embodiment of the invention the frequency is set to the critical band frequency scale by setting $\alpha=-0.47$ which sets the level of formant expansion on a scale closer to that of human hearing sensitivity. The output is the speech processed by the warped post-filter, which will be perceived to be louder than the unprocessed speech, but without requiring additional energy.

Post-Filter and LPC Bandwidth Expansion

The general LPC post-filter known in literature is described by, equation 9:

$$W(z) = \frac{A(z/\lambda_n}{A(z/\lambda_d)}$$

where A(z) represents the LPC filter coefficients of the all-pole vocal model, and $\lambda_d$ and $\lambda_n$ are the formant bandwidth adjustment factors, where $0<\lambda_d<\lambda_n<1$ and $\lambda_n=0.8$, $\lambda_d=0.4$ are typical values. The post-filter operates on speech frames of 20 ms corresponding to 160 samples at the sampling frequency of 8 000 sample/s. Though, the frames sizes can vary between 10 ms and 30 ms. For each frame of 160 speech samples, the speech signal is analyzed to extract the LPC filter coefficients. The LPC coefficients describe the all-pole model 1/A(z) of the speech signal on a per frame basis. In the implementation herein, the LPC analysis is performed twice per frame using two different asymmetric windows. First we describe the bandwidth adjustment factors $\lambda_d$ and $\lambda_n$ in the linear filter before we proceed to our warped filter. An LPC technique commonly used to alter formant bandwidth is given by, equation 10:

$$A(z/\gamma)|_{\gamma=1/r} = A(\check{z})|_{\check{z}=re^{jw}} = \sum_{k=0}^{p}(a_k r^{-k})e^{-jwk}$$

This equation is used for filters that, for example, sharpen formant regions for intelligibility, and for reducing the effect of quantization errors. It provides a way to evaluate the z transform on a circle with radius r greater than or less than the unit circle (where r=1). A graphical demonstration of the procedure is presented in FIG. 3. For 0<r<1 the evaluation is on a circle closer to the poles and the contribution of the poles has effectively increased, thus sharpening the pole resonance. Stability is of concern since 1/A(z) is no longer an analytic expression within the unit circle. For r>1 (bandwidth expansion) the evaluation is on a circle farther away from the poles and thus the pole resonance peaks decrease and the pole bandwidths are widened. The poles are always inside the unit circle and 1/A(z) is stable. The bandwidth adjustment technique simply requires a scaling of the LPC coefficients by a power series of r. This effectively is a method to evaluate the z transform on a circle greater than the unit circle. The new evaluation circle can be expressed as a function of the radius r, as shown by equation 11:

$$A(\check{z})|_{\check{z}=re^{jw}} = \sum_{k=0}^{p} a_k (re^{jw})^{-k}$$

It is interpreted as the z transform of a power series scaling of the $a_k$ coefficients and hence the A(z/λ) terminology. A power series expansion is given as:

$$A(\check{z}) = \sum_{k=0}^{p}(a_k r^{-k})e^{-jwk}$$

$$A(\check{z}) = a_0 + a_1 r^{-1} + a_2 r^{-2} + \ldots a_p r^{-p} | r = 1/\lambda$$

$$A\left(\frac{z}{\lambda}\right) = a_0 + a_1\left(\frac{z}{\lambda}\right)^{-1} + a_2\left(\frac{z}{\lambda}\right)^{-2} + \ldots a_p\left(\frac{z}{\lambda}\right)^{-p}$$

$$A(\check{z}) = A\left(\frac{z}{\lambda}\right)$$

Figure 7:
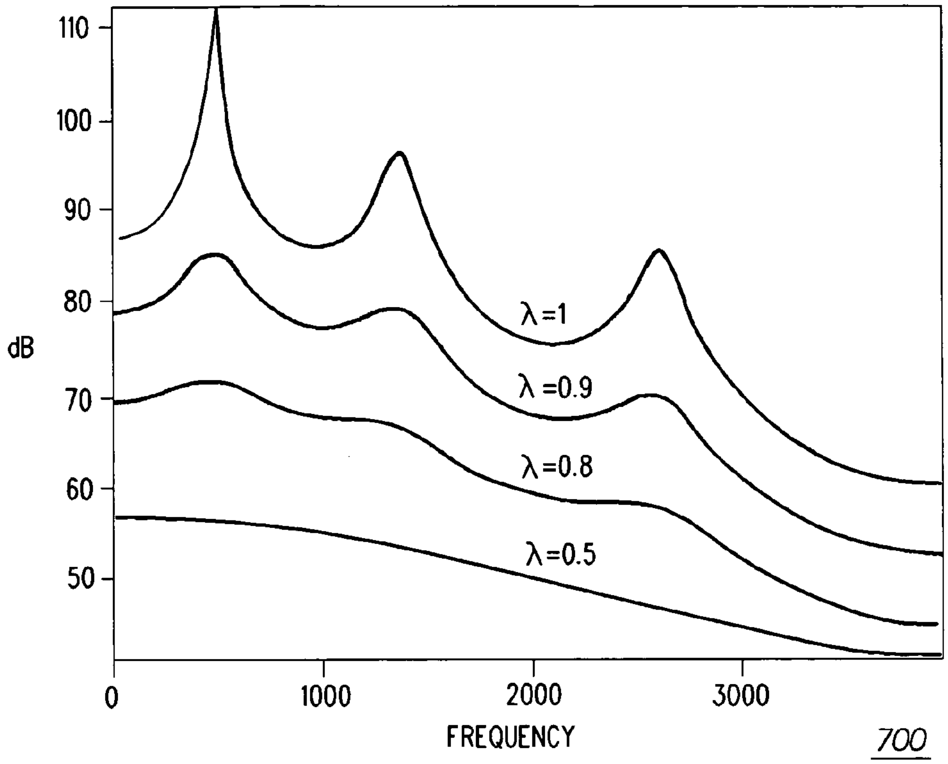
FIG. 7 shows the frequency response of an LPC inverse filter designed in accordance with an embodiment of the invention for various values of the bandwidth expansion term.

FIG. 7 shows a graph chart 700 of a frequency response of for a filter designed in accordance with an embodiment of the invention, using the series expansion above. Specifically, it shows the short-term filter frequency response for a vocal tract model of a synthetic vowel segment 1/A(z/λ) with various values of the bandwidth expansion parameter λ. Such a filter can be used to attenuate or amplify the formant regions of speech, and for this reason has been used in vocoder post-filter designs. A 10th-order filter (p=10) is usually sufficient for the post filter. Plots are separated by 10 dB for clarity. It can be seen that the response flattens as λ decreases. For voiced speech, the spectral envelope usually has a low-pass spectral tilt with roughly 6 dB per octave spectral fall off. This results from the glottal source low-pass characteristics and the lip radiation high frequency boost. FIG. 3 shows the response of 1/A(z/γ) for various values of γ. For γ=1 the evaluation is on the unit circle and the response is simply 1/A(z), which is the all pole model of the LPC filter. As γ becomes smaller the evaluation is farther off the unit circle and the contribution of the poles is farther away from the unit circle and hence the pole resonances decrease resulting in widening the formant bandwidths.

The $\gamma_n$ parameter was provided in the numerator of equation 9 to adjust for spectral tilt. Equation 9 reveals how the bandwidth adjustment terms $\gamma_n$ and $\gamma_d$ provide for the formant filtering effect. The numerator effectively adds an equal number of zeros with the same phase angles as the poles. In effect the post-filter response is the subtraction of the two bandwidth expanded responses seen in FIG. 7.

$$20 \log|H(ejw)| = 20 \log|1/A(z/\gamma_d)| - 20 \log|1/A(z/\gamma_n)$$

For $0<\gamma_n<\gamma_d<1$, 20 log|1/A(z/$\gamma_n$) is a very broad response which resembles the low-pass spectral tilt. Subtraction of this response from any of the responses in FIG. 7 will result in a formant enhanced spectrum with little spectral tilt.

This power series scaling describes how the z transform can be evaluated on a circle of radius r given the LPC coefficients. The operation is a function of the pole radius and determines the amount of bandwidth change. The evaluation of the z transform off the unit circle can be considered also in terms of the pole radius (the evaluation radius, r, is the reciprocal of the pole radius, γ). If the poles are well separated the change in bandwidth B can be related to the pole radius γ by, equation 12:

$$\Delta B = ln(\gamma) f_s/(2\pi)$$

where $f_s$ is the sampling frequency. Using this bandwidth expansion technique the LPC coefficients can be scaled directly. For 0<γn<γd<1, the filter provides a sharpening of the formants, or a narrowing of the formant bandwidth. For 0<γd<γn<1, the filter is a bandwidth expansion filter. Such a filter response would be the reciprocal of FIG. 7, where the formant sidelobes would be amplified in greater proportion than the formant peaks. The amount of formant emphasis or attenuation can be set by the bandwidth expansion factors γn and γd.

Warped LPC Bandwidth Expansion

The invention uses the LPC bandwidth adjustment technique on a critical band scale so as to expand the bandwidths of each pole on a scale closer to that of the human auditory system. The LPC pole enhancement technique is applied in the warped frequency domain to accomplish this task. This requires knowledge of warped filters. The LPC pole enhancement technique provides only a fixed bandwidth increase independent of the frequency of the formant as was seen in equation 12. In a Warped LPC filter (WLPC) the all-pass warping factor a can provide an additional degree of freedom for bandwidth adjustment.

Warping refers to alteration of the frequency scale or frequency resolution. Conceptually it can be considered as a stretching compressing, or otherwise modifying the spectral envelope along the frequency axis. The idea of a warped frequency scale FFT was originally proposed by Oppenheim. The warping characteristics allow a spectral representation which closely approximates the frequency selectivity of human hearing. It also allows lower order filter designs to better follow the non-linear frequency resolution of the peripheral auditory system. Warped filters require a lower order than a general FIR or IIR filter for auditory modeling since they are able to distribute their poles in accordance with the frequency scale. Since warped filter structures are realizable, the linear bandwidth expansion technique of equation 9 can be used in this transformed space to achieve nonlinear bandwidth expansion.

Figure 8:
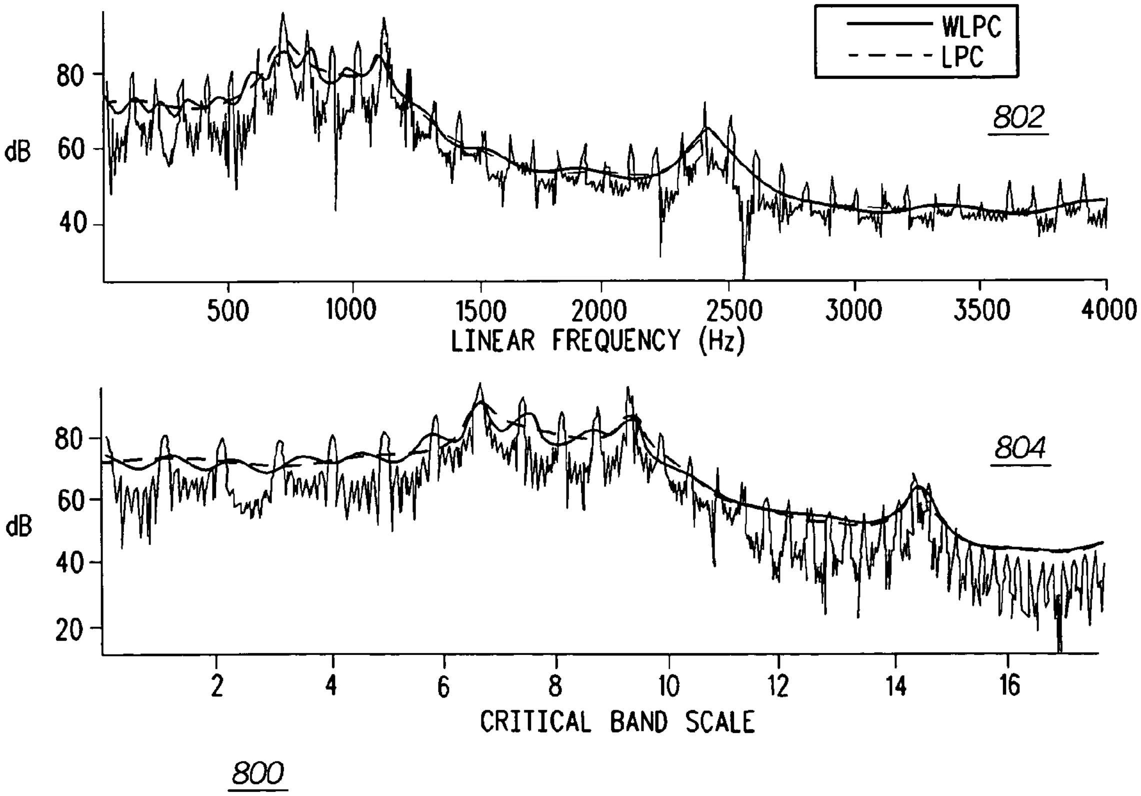
FIG. 8 shows a graph chart of both a linear predictive code filter and a warped linear predictive code filter, in accordance with an embodiment of the invention.

Warped filters have been successfully applied to auditory modeling and audio equalization designs. FIG. 8 shows a graph chart 800 of both a linear predictive code filter and a warped linear predictive code filter. Specifically, a 32nd order LPC 802 and Warped LPC 804 model response for a synthetic vowel/a/at a sampling frequency of 8 KHz on a linear axis, and with a warped frequency scale approximating the critical band scale. The WLPC model effectively places more poles in the low frequency regions due to the warped frequency scale, and thus shows pronounced emphasis where the poles have migrated. A higher than normal order is used to demonstrate the differences. The same order WLPC model clearly discriminates more of the low frequency peaks than the linear model. The WLPC analysis demonstrates that a better fit to the auditory spectrum can be achieved with a lower order filter compared to LPC. In this example a model order high enough to resolve the pitch harmonics is not used. It is desirable to keep the excitation and the vocal envelope separate, but the example illustrates the modeling accuracy of WLPC for the auditory spectrum.

All-Pass Systems

A warping transformation is a functional mapping of a complex variable. For warped filters the mapping function is in the z domain, and must provide a one-to-one mappings of the unit circle onto itself. The two pairs of transformations are between the z domain and the warped z domain; z=g(ž) and z=f(ž). In the design of a warped filter, the functional transformations must have an inverse mapping z=g{f(z)}. It must be possible to return to the original z domain. The bilinear transform is one such mapping which satisfies the requirements of being one-to-one and invertible. The bilinear transform corresponds to the first order all-pass filter, given as equation 13

$$z^{-1} = \frac{z^{-1} - \alpha}{1 - \alpha \cdot z^{-1}}$$

The all-pass has a frequency response magnitude independent of frequency and passes all frequencies with unity magnitude. All-pass systems can be used to compensate for group delay distortions or to form minimum phase systems. In the case of warped filters, their predetermined ability to distort the phase is used to favorably alter the effective frequency scale. The feedback term α provides a time dispersive element that provides the warping characteristics. By virtue, the all-pass element passes all signals with equal magnitude. The warping characteristics can be evaluated by solving for the phase. The phase response demonstrates the warping properties of the all-pass. Setting $z=e^{-jw}$ and solving for the phase $\tilde{w}$, in equation 14:

$$\tilde{w} = \tan^{-1}\left(\frac{(1-\alpha)^2 \sin(w)}{(\alpha^2+1)\cos(w) + 2\alpha}\right)$$

Figure 9:
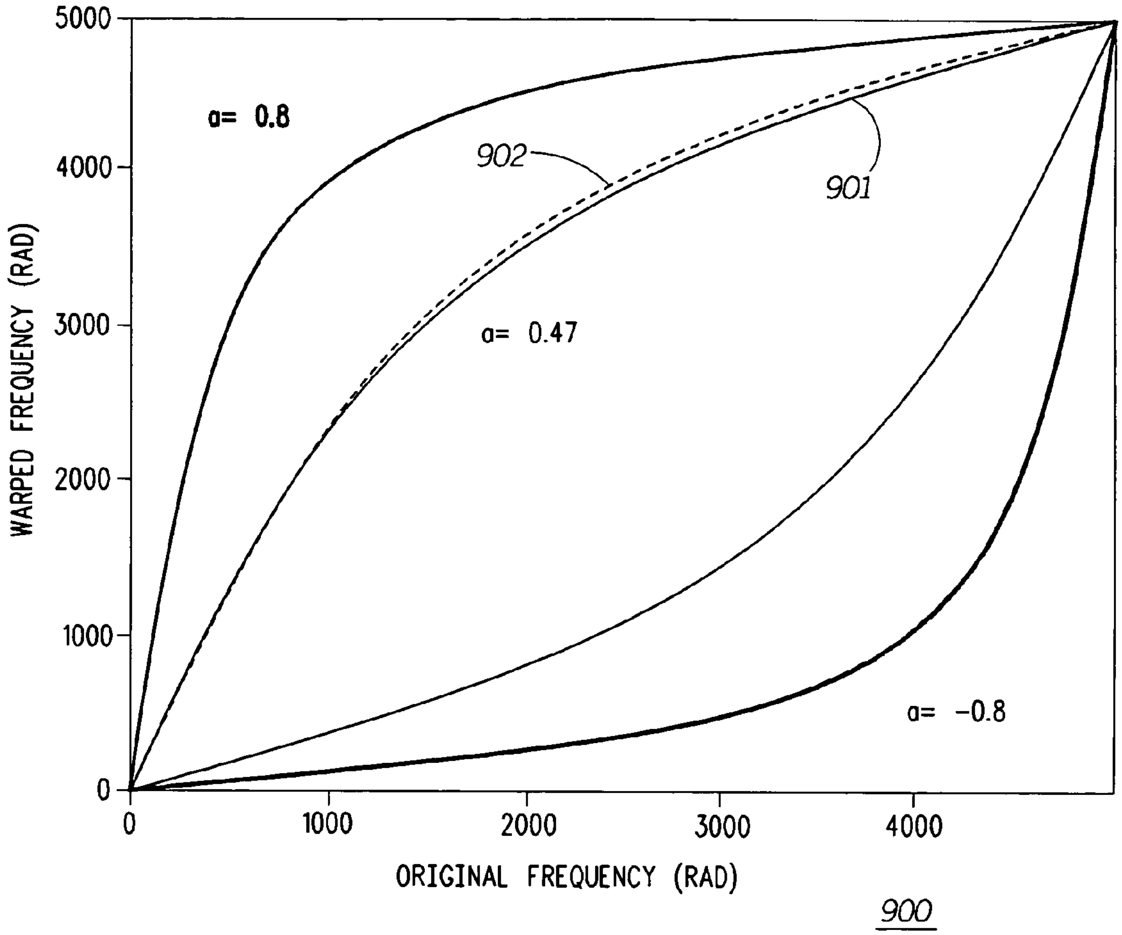
FIG. 9 shows a shows a graph chart illustrating the different warping characteristics of a warping filter, in accordance with an embodiment of the invention.

Equation 14 gives the phase characteristics of the all-pass element, where α sets the level of frequency warping. The warped z domain is described by $\tilde{z}$ with phase $\tilde{w}$ as $\tilde{z}=e^{-jw}$. FIG. 9 shows a graph chart 900 illustrating the different warping characteristics set by α in equation 14. For α>0 low frequencies are expanded high frequencies are compressed. For z,900 <0 high frequencies are expanded and low frequencies are compressed. The variable 'a' has the effect of setting the warping characteristics. When α=0 there is no warping and the all-pass element reduces to the unit delay element.

Zwicker and Terhardt provided the following expression to relate critical band rate and bandwidth to frequency in kHz, equation 15:

$$z/\text{Bark}=13\tan^{-1}(0.76f)+3.5\tan^{-1}(f)^2$$

For a sampling frequency of 10 KHz, the warping factor α=0.47 (901) in equation 14 of the all-pass element provides a very good approximation to the critical band scale as seen in FIG. 9, by the dotted line plot 902. The warping factor α is positive for critical band warping and depends on the sampling frequency by the following, equation 16:

$$\alpha = 1.0674\sqrt{\frac{2}{\pi}\tan\left(\frac{0.06583 \cdot f_s}{1000}\right)} - 0.1916$$

Warped Filter Structures

Digital filters typically operate on a uniform frequency scale since the unit delay are frequency independent, i.e., an N-point FFT gives N frequency bins of equal frequency resolution N/fs. In a warped filter, all-pass elements are used to inject time dispersion through a locally recurrent feedback loop specified by α. The all pass injects frequency dependence and results in non-uniform frequency resolution.

Figure 10:
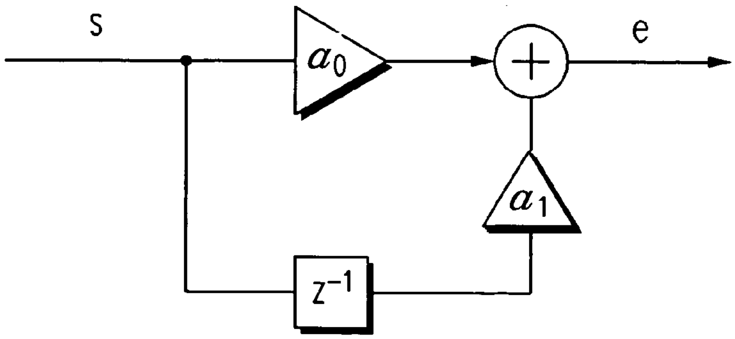
FIGS. 10-11 show the substitution of the unit delay element $z^{-1}$ with the all-pass element for a first order FIR in accordance with an embodiment of the invention.
Figure 11:
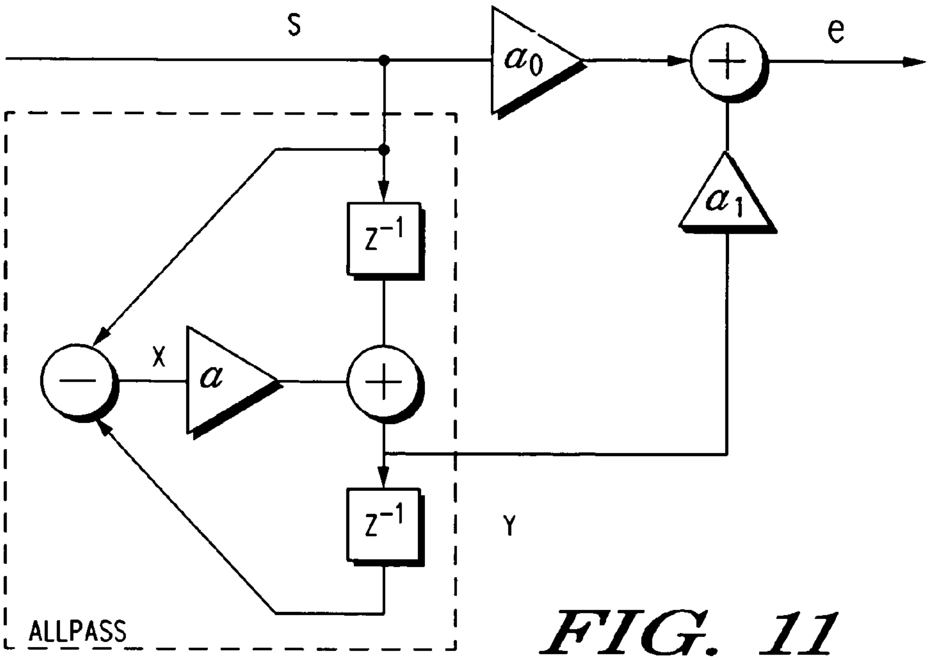

FIGS. 10 and 11 show the substitution of the unit delay element $z^{-1}$ with the all-pass element for a first order FIR. A FIR filter where the filter coefficients are the LPC terms is known as a prediction-error (inverse) filter, since the FIR is the inverse of the all-pole model 1/A(z) which describes the speech signal. The LPC coefficients are efficiently solved for with the Levinson-Durbin algorithm, which applies a recursion to solve for the standard set of normal equations:

$$\begin{bmatrix} r_m(0) & r_m(1) & \dots & r_m(p-1) \\ r_m(1) & r_m(0) & \dots & \dots \\ \dots & \dots & r_m(0) & \dots \\ r_m(p-1) & \dots & \dots & r_m(0) \end{bmatrix} \begin{bmatrix} a_1 \\ a_2 \\ \dots \\ a_p \end{bmatrix} \begin{bmatrix} r_m(1) \\ r_m(2) \\ \dots \\ r_m(p) \end{bmatrix}$$

Recall, that the autocorrelation method (versus the covariance method) is used in setting up the normal set of equations, where $r_m$ are the autocorrelation values at frame time m.

In the same manner that the recursion can be applied to the autocorrelation to generate the LPC terms, the recursion can be applied to the warped autocorrelation to obtain the WLPC terms. One can consider the warped autocorrelation as the autocorrelation function where the unit delays are replaced by all-pass elements. Recall, the autocorrelation is a convolution operation where the convolution is described by a unit delay operator, i.e., for each autocorrelation value $r_m(n)$, point wise multiply all speech samples s(n), and sum them for $r_m(n)$, then shift by one sample and repeat the process for all $r_m(n)$. Now, realize that the one sample shift (unit delay) can be replaced by an all-pass element and the procedure can now be described as the warped autocorrelation function. Now the convolution requires a shift with an associated delay (memory element) described by the warping factor. The warped autocorrelation calculation where the unit delay elements are replaced by all-pass elements is a computationally expensive calculation. Thanks to symmetry, there exists an efficient recursion called the Oppenheim recursion which equivalently calculates the warped autocorrelation, $\tilde{r}_k$. Once the warped autocorrelation is determined, the Levinson-Durbin recursion can be used to solve for the WLPC terms, $\tilde{a}_k$ (note the overbar to describe the warped sequence). Now, in the same manner that the LPC terms can be used in an FIR filter, the WLPC terms can be used in a FIR filter where the unit delays are replaced with all-pass elements. This configuration is called a WFIR filter.

The FFT of the autocorrelation sequence processed by the Oppenheim recursion demonstrates the warping characteristics. FIG. 8 shows the resulting frequency response of the Oppenheim recursion as applied to the autocorrelation sequence of a synthetic speech segment with $\alpha$=0.47. It can be seen that autocorrelation warping effectively stretches the spectral envelope rightwards. Critical bandwidths increase with increasing frequency. Since the warped spectrum is on a critical band scale, the large-bandwidth, high-frequency regions of the original spectrum become compressed, and effectively result in a warped spectrum stretched towards the right. For $0<\alpha<1$ frequency warping stretches the low frequencies and compresses the high frequencies. For $-1<\alpha<0$ frequency warping compresses the low frequencies and stretches the high frequencies.

WFIR (Analysis) and WIIR (Synthesis) Filter Elements

The analysis filter is referred to as the inverse filter. It is the all-zero filter of the inverse all-pole speech model. The prediction coefficients $a_k$ define the prediction error (analysis) filter given by $$A(z) = \sum_{k=0}^{p} a_k z^{-k}$$

where this represents a conventional FIR when $a_k$ is normalized for $a_0=1$. We can replace the unit delay operator of a linear phase filter with an all-pass element. The $1^{st}$ order analysis demonstrates the direct substitution of an all-pass filter into the unit delay and the warping characteristics of an all-pass element. This is a straightforward substitution for the FIR (analysis) form of any order. In a WFIR filter the unit delay elements ($z^{-1}$) of A(z) are directly replaced with all-pass elements $z^{-1}=(z^{-1}-\alpha)/(1-\alpha\cdot z^{-1})$.

In a warped recursive filter (WIIR), however, the all-pass delay for the synthesis filter is not a simple substitution. In a WIIR filter it is necessary to perform a linear transformation of the warped coefficients, A(z), for the WIIR filter to compensate for an unrealizable time dependency, i.e. to be stable. A linear transformation is applied to the A(z) coefficients to generate the B(z) coefficient set used in the warped filter. It is a binomial representation which converts the all-pole polynomial in $z^{-1}$ to an a polynomial in $z^{-1}/(1-\alpha\cdot z^{-1})$ in the form of:

$$A(z) = \sum_{k=0}^{p} b_k \left[\frac{z^{-1}}{1-\alpha\cdot z^{-1}}\right]^k$$

The coefficient transformation can be implemented as an efficient algorithm recursion as discussed in the low-level design section.

Figure 12:
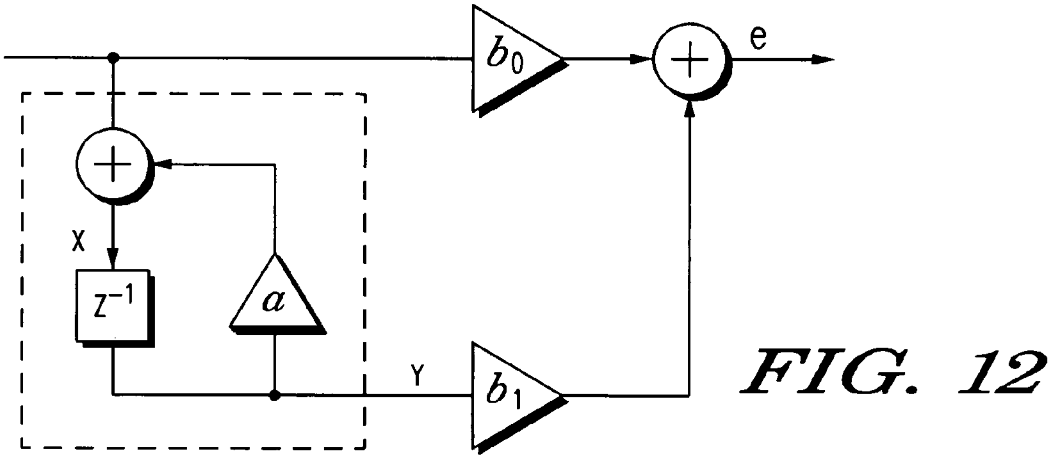
FIG. 12 shows a filter implementation in accordance with an embodiment of the invention.

FIG. 12 shows the final results of replacing the unit delay of a $1^{st}$ order FIR filter with an all pass, and then transforming the $a_k$ coefficients to the $b_k$ coefficient set, and using the $b_k$ coefficients in a realizable filter. This is the modified WFIR tapped delay line form, where modified implies the conversion of the $a_k$ filter coefficients.

Figure 13:
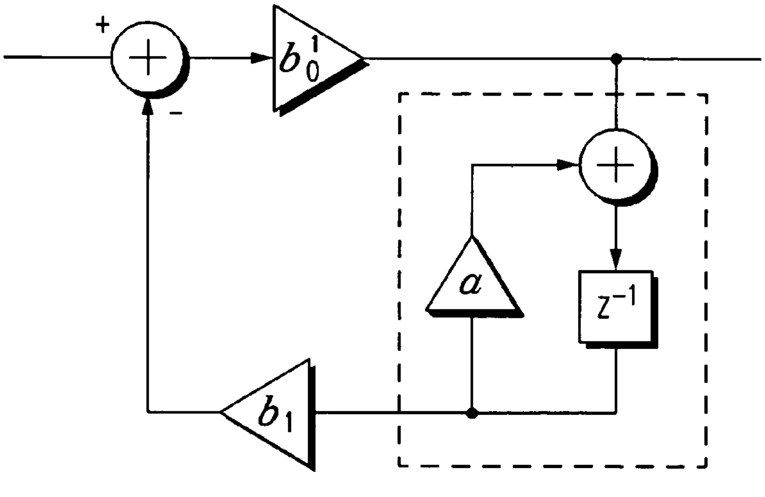
FIG. 13 shows a filter implementation in accordance with an embodiment of the invention.

FIG. 13 shows the final results of replacing the unit delay of an $1^{st}$ order IIR with an all pass, and then transforming the $a_k$ coefficients to the $b_k$ coefficient set, and using the $b_k$ coefficients in a realizable recursive filter. This is the modified WIIR tapped delay line form, where modified implies the conversion of the $a_k$ filter coefficients. The B(z) coefficients for the WFIR and WIIR can then be directly used in the post-filter, equation 17:

$$W(\tilde{z}) = \frac{B(\tilde{z}/\lambda_n)}{B(\tilde{z}/\lambda_d)}$$

FIG. 5 shows the canonic direct form of the WLPC filter with critical band expansion for p=3, though a p=10 order is actually used in the design. The filter is a concatenation of a WFIR and WIIR filter where the two delay chains of each filter are collapsed together as a single center delay chain. This is the general form of the warped bandwidth expansion filter used to adjust the formant poles on a critical band scale. The $b_k$ coefficients are the bandwidth expanded terms in both the WFIR (right) and WIIR (left) structure.

Figure 14:
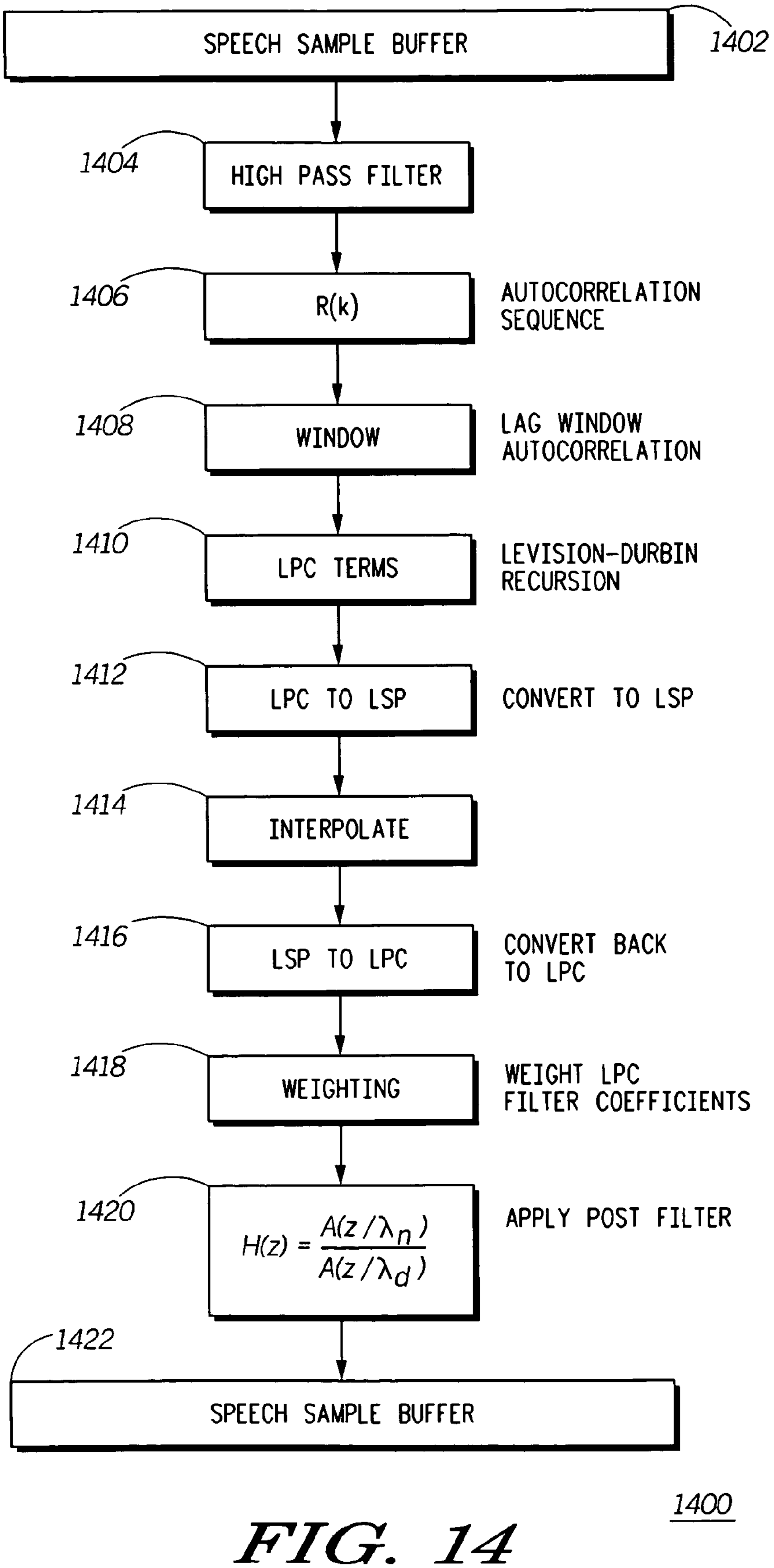
FIG. 14 shows a method of filtering speech to enhance the perceived loudness of the speech, in accordance with an embodiment of the invention.
Figure 15:
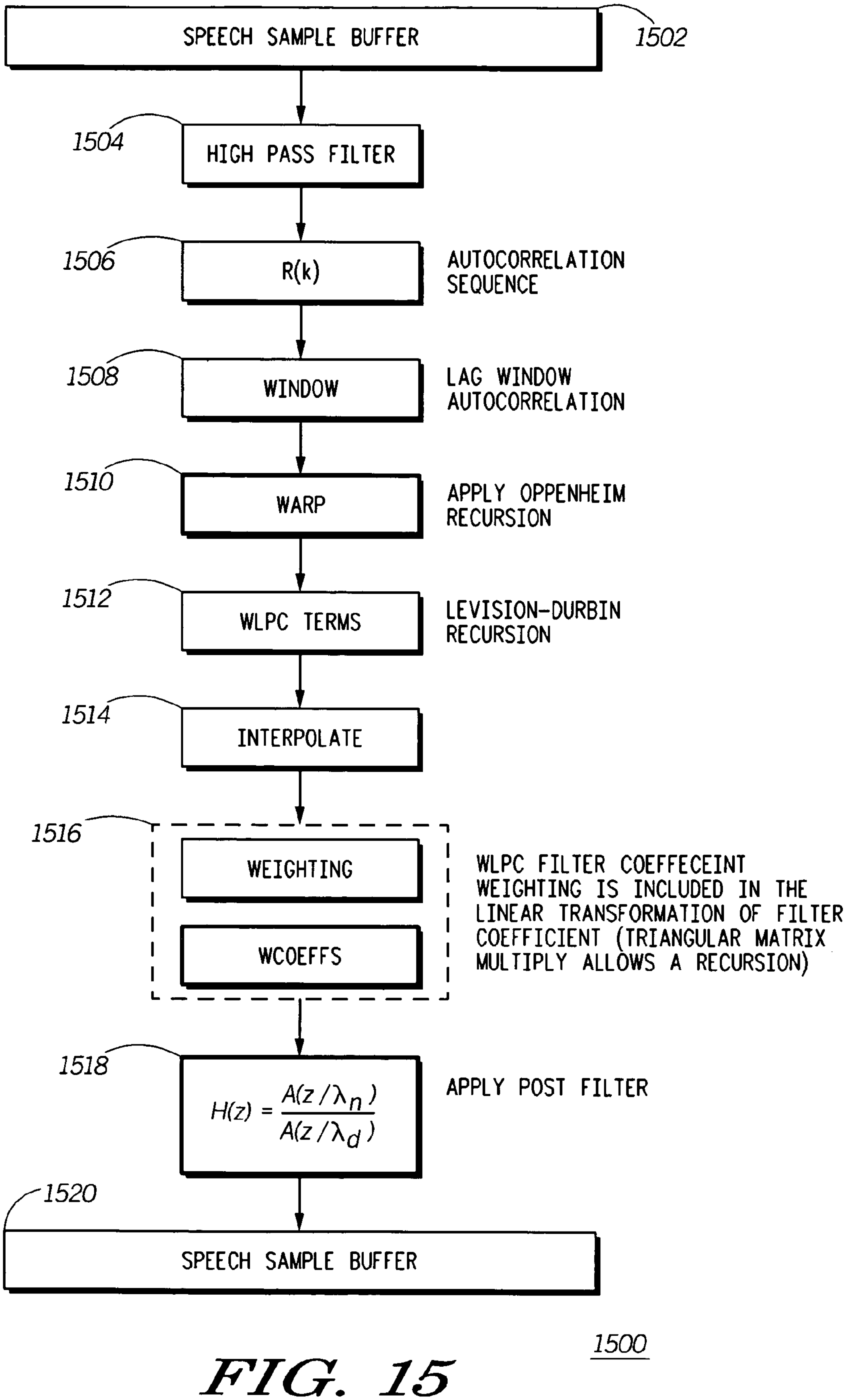
FIG. 15 shows a method of filtering speech to enhance the perceived loudness of the speech, in accordance with an embodiment of the invention.

FIGS. 14 and 15 show flow chart diagrams of the methods for calculating and implementing the coefficients of the standard linear post-filter and warped post-filter. The overall steps are similar but the warped filter requires three additional procedures: 1) autocorrelation warping (Oppenheim recursion), 2) a linear transformation of the WLPC coefficients (recursion) which also includes the pole-displacement model for bandwidth expansion, and 3) the inclusion of a locally recurrent feedback term a in the post filter seen above. Also, the 3 blocks of converting LPC to LSP, interpolating the LSPs, and then converting back to LPC terms can be simplified. LSP interpolation can provide a better voice quality than LPC interpolation in smoothing the filter coefficient transition. However, if necessary, the three blocks can be removed and the LPC coeffs can be interpolated directly to reduce complexity requirements. The method starts with s a speech sample being provided in a buffer 1402. The speech sample if first filtered vi a high pass filter 1404. After the high pass filtering the autocorrelation sequence is performed 1406, followed by lag window correlation 1408. Then the LPC terms are derived, such as by Levinson-Durbin recursion 1410. The LPC terms are them converted to LSP 142, interpolated 1414, and converted back to LPC 1416. The LPC filter coefficients are then weighted 1418, and the post filter is applied 1420. After the post filter, which provides the formant bandwidth expansion, the result is written to a speech buffer 1422.

FIG. 15 shows a flow chart diagram 1500 of a method warping the speech sample so that the frequency resolution corresponds to a human auditory scale, in accordance with an embodiment of the invention. O commence the method, a speech sample or frame or frames is written into a buffer 1502. The speech sample if first filtered via a high pass filter 1504. After filtering, the autocorrelation sequence is performed 1506, followed by lag window correlation 1508. To warp the sample, Oppenheim recursion may be used 1510. Then the warped LPC terms are obtained, such as by Levinson-Durbin recursion 1512. Then an interpolation is performed 1514. Next the sample is weighted using the warped LPC coefficients 1516. WLPC filter coefficient weighting is included in the linear transformation of filter coefficients (triangular matrix multiply allows a recursion).

Figure 16:
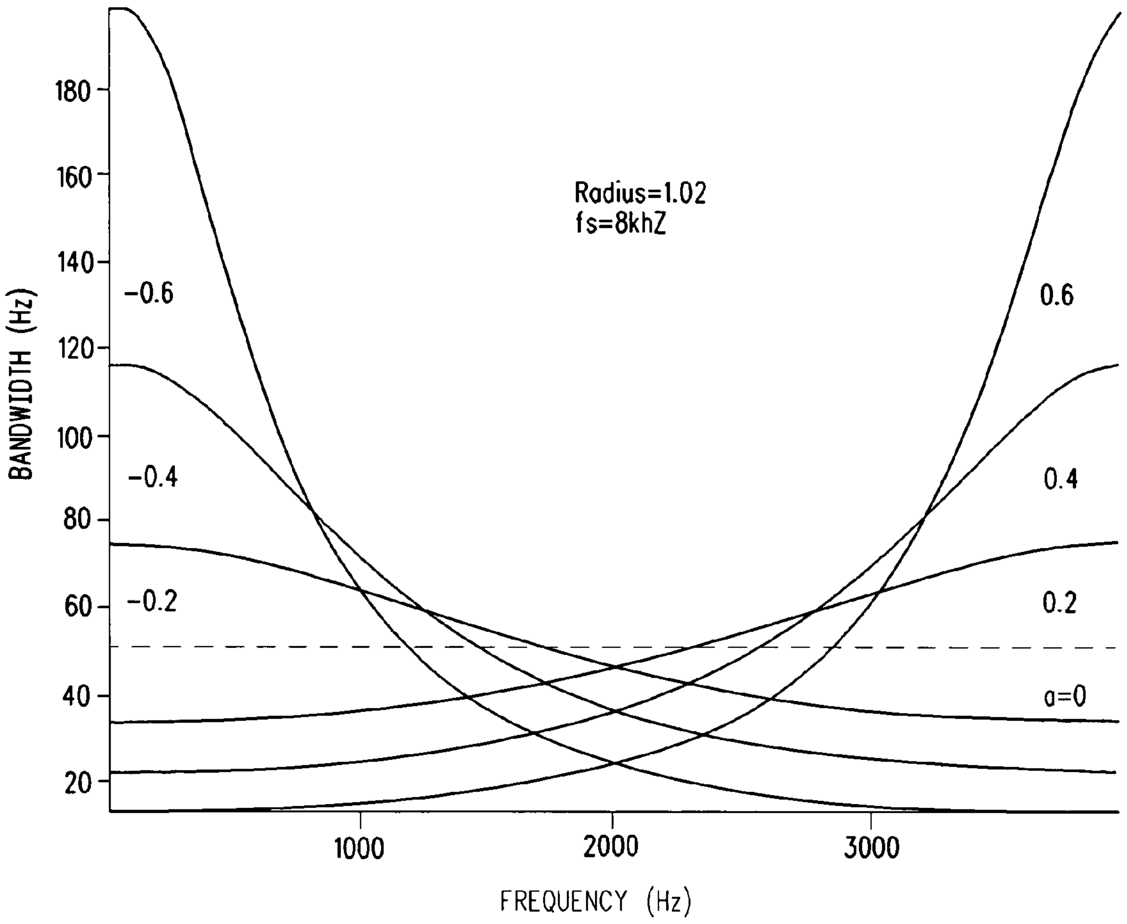
FIG. 16 shows a family of bandwidth expansion curves given a particular sampling frequency and evaluation radius.

Referring now to FIG. 16, there is shown a family of bandwidth expansion curves given a particular sampling frequency and evaluation radius. This graph chart characterizes the warped bandwidth filter of equation 17. The sampling frequency fs=8 KHz, and the evaluation radius is r=1.02. The a values specify the level of bandwidth expansion or compression. For $\alpha \neq 0$ the intersection of each curve with the $\alpha=0$ curve sets the crossover frequency. It can be seen that at $\alpha=0$ there is uniform bandwidth expansion across all frequencies and the bandwidth corresponds to B=50 Hz for fs=8 KHz and $\alpha=0$.

The change in bandwidth is specified by the evaluation radius, sampling frequency, and a values. The bandwidth expansion is constant in the warped domain. A constant bandwidth expansion in the warped domain results in a critical bandwidth expansion with a proper selection of the frequency warping parameter, $\alpha$. This is a goal of the invention. Additionally, it should be noted that the all-zero filter in the numerator of equation 17 generates the true residual (error) signal. This signal is then effectively filtered by the bandwidth expanded model in the denominator. This implies a re-synthesis of the speech signal. A preferred approach is to shape the spectrum from a bandwidth expanded version of the all-pole model. The bandwidth expansion technique is applied to the numerator to attenuate formant peaks in relation to formant sidelobes. For $0<\gamma d<\gamma n<1$, the warped post-filter of equation 17 performs the bandwidth expansion by non linear spectral shaping.

Low Level Design

This section contains a general description of the low-level design.

Windowing and Autocorrelation Computation

LPC analysis is performed twice per frame using two different asymmetric windows. The first window has its weight concentrated at the second subframe and it consists of two halves of Hamming windows with different sizes. The window is given by:

$$w_I(n) = \begin{cases} 0.54 - 0.46\cos\left(\dfrac{\pi \cdot n}{L_1^{(I)} - 1}\right) & n = 0 \ldots L_1^{(I)} - 1 \\ 0.54 + 0.46\cos\left(\dfrac{\pi \cdot (n - L_1^{(I)})}{L_2^{(I)} - 1}\right) & n = L_1^{(I)} \ldots L_1^{(I)} + L_2^{(I)} - 1 \end{cases}$$

Figure 17:
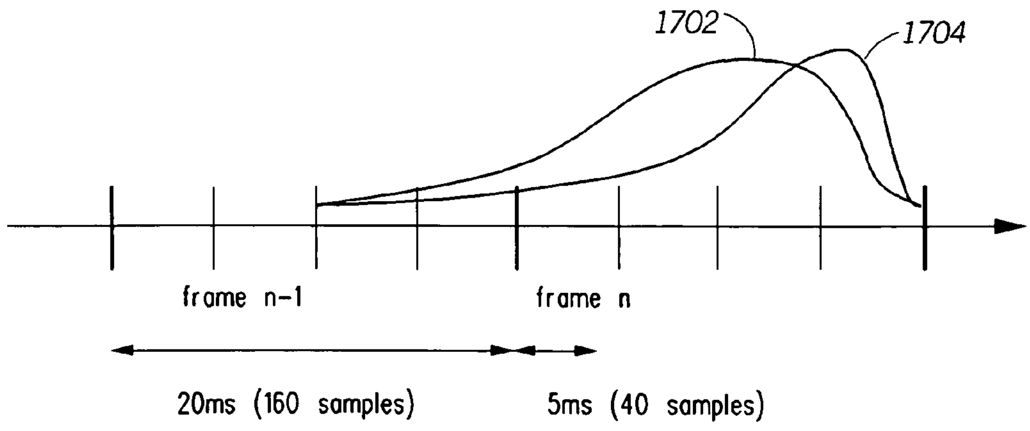
FIG. 17 shows graph diagram of the two LP analysis windows for use in implementing the invention, in accordance with an embodiment of the invention.

The values $L^{(I)}_1=160$ and $L^{(I)}_2=80$ are used. The second window as its weight concentrated at the fourth subframe and it consists of two parts: the first part is half a Hamming window and the second part is a quarter of a cosine function cycle. The window is given by:

$$w_{II}(n) = \begin{cases} 0.54 - 0.46\cos\left(\dfrac{2\pi \cdot n}{L_1^{(II)} - 1}\right) & n = 0 \ldots L_1^{(II)} - 1 \\ 0.54 + 0.46\cos\left(\dfrac{2\pi \cdot (n - L_1^{(II)})}{L_2^{(II)} - 1}\right) & n = L_1^{(II)} \ldots L_1^{(II)} + L_2^{(II)} - 1 \end{cases}$$

where the values $L^{(II)}_1=160$ and $L^{(II)}_2=80$ are used. Note that both LPC analyses are performed on the same set of speech samples. The windows are applied to 80 samples from past speech frame in addition to the 160 samples of the present speech frame. No samples from future frames are used (no look ahead). FIG. 17 shows a graph diagram 1700 of the two LP analysis windows 1702, 1704. The auto-correlations of the windowed speech s'(n),n=0, . . . 239 are computed by:

$$r_{ac}(k) = \sum_{n=k}^{239} s'(n)\,s'(n-k) \quad k = 0, \ldots p-1$$

and a 60 Hz bandwidth expansion is used by lag windowing the autocorrelations using the window:

$$w_{lag}(i) = \exp\left[\frac{1}{2}\left(\frac{2\pi \cdot f_0 \cdot i}{f_s}\right)\right] \quad i = 1, \ldots p$$

where $f_0=60$ Hz and $f_s=8000$ Hz is the sampling frequency. Further, $r_{ac}$ is multiplied by the white noise correction factor 1.0001 which is equivalent to adding a noise floor at −40 dB Oppenheim Recursion The Oppenheim recursion is applied to the autocorrelation sequence for frequency warping. However, a lag window of 230 Hz is used in place of the 60 Hz bandwidth expansion window in the previous subsection. This window size prevents the spectral resolution from being increased so much in a certain frequency range that single harmonics appear as spectral poles; further the lag window alleviates undesirable signal-windowing effects. The recursion is described by:

$$\begin{aligned}
&\text{for } 0 \le n \le p\\
&\quad \tilde{r}_0^{(n)} = \alpha\,[\tilde{r}_0^{(n-1)} + R(p-n)]\\
&\quad \tilde{r}_1^{(n)} = \alpha\,[\tilde{r}_0^{(n-1)} + (1-\alpha^2)\,\tilde{r}_0^{(n-1)}]\\
&\quad \text{for } 2 \le k \le p\\
&\quad\quad \tilde{r}_k^{(n)} = \alpha\,[\tilde{r}_k^{(n-1)} - \tilde{r}_{k-1}^{(n)}] + \tilde{r}_{k-1}^{(n-1)}\\
&\quad \text{end}\\
&\text{end}
\end{aligned}$$

where R(n) represents the ones sided autocorrelation sequence truncated to length p. Again, $\alpha$ is the all-pass warping factor which sets the frequency scale to the critical band scale, and p is the LPC order. The transform holds only for a casual sequence. Since the autocorrelation is even, we represent R(n) as the one-sided autocorrelation sequence $\{r_0/2, r_1, r_2, \ldots r_{p-1}\}$. After the recursion, $\tilde{r}_0$ has to be doubled (i.e., $r_0$ with the tilde sign) since it is halved prior to the recursion. This is the warped autocorrelation method and returns a warped autocorrelation sequence $\tilde{R}(k)=\tilde{r}_k^{(p)}$. The superscript (p) denotes the time index. Thus, $\tilde{r}_k^{(p)}$ represents the final values of last recursion. This method operates directly on the time sampled autocorrelation sequence.

The WLPC coefficients are obtained from the warped autocorrelation sequence in the same way the LPC coefficients are derived from the autocorrelation sequence. The normal set of equations which define the linear prediction set are efficiently solved for using the Levinson-Durbin algorithm. The Levinson-Durbin is applied to the warped autocorrelation sequence to obtain the WLPC terms.

Levinson-Durbin Algorithm

The modified autocorrelations $\tilde{r}_{ac}^{(0)}=1.001\cdot\tilde{r}_{ac}^{(0)}$ and $\tilde{r}_{ac}^{(k)}w_{lag}(k)$, k=1, . . . p are used to obtain the direct form LP filter coefficients $a_k$, k=1, . . . 10.

$$\begin{aligned}
&E_{LD}^{(0)} = \tilde{r}_{ac}(0)\\
&\text{for } i = 1 \text{ to } 10\\
&\quad k_i = -\left[\sum_{j=0}^{i-1} a_j^{(i-1)}\tilde{r}_{ac}(i-j)\right] \Big/ E_{LD}^{(i-1)}\\
&\quad a_i^{(i)} = k_i\\
&\quad \text{for } j = 1 \text{ to } (i-1)\\
&\quad\quad a_j^{(i)} = a_j^{(i-1)} + k_i \cdot a_{i-j}^{(i-1)}\\
&\quad \text{end}\\
&\quad E_{LD}^{(i)} = (1-k_i^2)\,E_{LD}^{(i-1)}\\
&\text{end}
\end{aligned}$$

The final solution is given as $a_j=a_j^{(10)}$ j=1, . . . 10. The LPC filter coefficients can then be interpolated frame to frame.

Weighting

The weighting is a power series scaling of the LPC coefficients as previously mentioned. For the LPC model, a power series scaling is directly applied to the LPC coefficients. In the warped post-filter, the weighting is included in the linear transformation of the filter coefficients. The linear transform accepts a bandwidth expansion term (r) which properly weights the WLPC terms equivalent to a power series expansion. The WLPC terms cannot be scaled directly with a power series of r due to this transformation.

Wcoeffs: Linear Transformation of Filter Coefficients

The WLPC coefficients can be directly used in a WFIR filter just as the LPC coefficients are used in a FIR filter. A FIR filter where the filter coefficients are the LPC terms is known as a prediction-error (inverse) filter, since the FIR is the inverse of the all-pole model 1/A(z) which describes the speech signal. A WFIR filter is a FIR filter where the unit delays are replaced by all-pass sections. A WFIR filter is essentially a Laguerre filter without the first-stage low-pass section. The WLPC coefficients are stable in a WFIR filter. However, they are unstable in the WIIR filter and require a linear transformation to account for an unrealizable time dependency. The linear transformation is equivalent to multiplication by a fixed triangular matrix, and a triangular matrix fortunately allows for the efficient Oppenheim recursion:

$$\begin{aligned}
&b_p = \tilde{a}_p\\
&\text{for } 0 \le n \le p\\
&\quad b_{p-n} = \tilde{a}_{p-n} - r^{-1}\alpha \cdot b_{p-n+1}\\
&\quad \text{if } (n > 1)\\
&\quad \text{for } k = p-n+1 \ldots p-1\\
&\quad\quad b_k = r^{-1}(1-\alpha^2)\cdot b_k - r^{-1}\alpha \cdot b_{k+1}\\
&\quad \text{end}\\
&\text{end}
\end{aligned}$$

where $\tilde{a}_p$ are the WLPC coefficients, p is the WLPC order, $\alpha$ is the all-pass warping factor, and r>1 is the evaluation radius for bandwidth expansion. The recursion is equivalent to a modification with the binomial equations:

$$b_k = \sum_{n=k}^{p} C_{kn}\tilde{a}_n \text{ for } C_{kn} = \binom{n}{k}(1-\alpha^2)^k(-\alpha)^{n-k}r^{-k}$$

Adaptive Post-filtering

The adaptive post filter is the cascade of two filters: an FIR and IIR filter as described by W(z).

$$W(z) = \frac{A(z/\lambda_n)}{a(z/\lambda_d)}$$

The post filter coefficients are updated every subframe of 5 ms. A tilt compensation filter is not included in the warped post-filter since it inherently provides its own tilt adjustment. The warped post-filter is similar to the linear post filter above but it operates in the warped z domain (z with an overbar):

$$W(\bar{z}) = \frac{B(\bar{z}/\lambda_n)}{B(\bar{z}/\lambda_d)}$$

An adaptive gain control unit is used to compensate for the gain difference between the input speech signal s (n) and the post-filtered speech signal $s_f(n)$. The gain scaling factor the present subframe is computed by:

$$g_{sc} = \sqrt{\frac{\sum_{n=0}^{39} s^2(n)}{\sum_{n=0}^{39} s_f^2(n)}}$$

The gain scaled post-filtered signal s'(n) is given by:

$$s'(n)=\beta_{sc}(n)s'_f(n)$$

where $\beta_{sc}(n)$ is updated in sample by sample basis and given by:

$$\beta_{sc}(n)=\eta\cdot\beta_{sc}(n-1)+(1-\eta)g_{sc}$$

where $\eta$ is an automatic gain factor with value of 0.9.

Implementation Method

The warped post-filter technique applies critical band formant bandwidth expansion to the vowel regions of speech without changing the vowel power to elevate perceived loudness. Vowels are known to contain the highest energy, have a smooth spectral envelope, long temporal sustenance, strong periodicity, high tonality and are targeted for this procedure. Hence, the adaptive post-filtering factors are adjusted as a level of speech tonality to target the voiced vowel regions. The bandwidth factor is made a function of tonality, using the Spectral Flatness Measure (SFM) for bandwidth control and a compressive linear function was used to smooth the change of radius over time. An automatic technique was developed and implemented on a real-time (frame by frame) basis. The warped bandwidth filter of equation 17 is used to subjectively enhance the perception of speech loudness. In one embodiment of the invention, the filtering is performed with frame sizes of 20 ms, 10th order WLPC analysis, 50% overlap and add with hamming windows, $\lambda_d$0.4, and $\lambda_n$ adjusted between $0.4<\lambda_n<0.85$ as a function of tonality using the spectral flatness measure.

The spectral flatness measure (SFM) was used to determine the tonality and a linear ramp function was used to set $\lambda_n$ based on this value. The SFM describes the statistics of the power spectrum, P(k). It is the ratio of the geometric mean to the arithmetic mean:

$$SFM = 1 - \frac{\sqrt[N]{\prod_{k=1}^{N} P(k)}}{\frac{1}{N}\sum_{k=1}^{N} P(k)}$$

We only want to bandwidth broaden vowel regions of speech because of their high energy content and smooth spectral envelope. An SFM of 1 indicates complete tonality (such as a sine wave) and an SFM of 0 indicates non-tonality (such as white noise). For a tonal signal such as a vowel, we want the maximum bandwidth expansion, so $\lambda_n=0.85$. For non-tonal speech, we want a minimal contribution of the warped filter, so we set $\lambda_n=0.4$. The SFM values between 0.6 and 1, were linearly mapped to $0.4<\lambda_n<0.85$, respectively, to provide less expansion in non-vowel regions and more expansion in vowel regions. The 0.6 clip was set to primarily ensure that tonal components were considered for formant expansion.

Thus, the invention provides a means for increasing the perceived loudness of a speech signal or other sounds without increasing the energy of the signal by taking advantage of psychoacoustic principle of human hearing. The perceived increase in loudness is accomplished by expanding the formant bandwidths in the speech spectrum on a frame by frame basis so that the formants are expanded beyond their natural bandwidth. The filter expands the formant bandwidths to a degree that exceeds merely correcting vocoding errors, which is restoring the formants to their natural bandwidth. Furthermore, the invention provides for a means of warping the speech signal so that formants are expanded in a manner that corresponds to a critical band scale of human hearing.

In particular, the invention provides a method of increasing the perceived loudness of a processed speech signal. The processed speech signal corresponds to, and is derived from a natural speech signal having formant regions and non-formant regions and a natural energy level. The method comprises expanding the formant regions of the processed speech signal beyond a natural bandwidth, and restoring the energy level of the processed speech signal to the natural energy level. Restoring the energy level may occur contemporaneously upon expanding the formant regions. The expanding and restoring may be performed on a frame by frame basis of the processed speech signal. The expanding and restoring may be selectively performed on the processed speech signal when the frame contains substantial vowelic content and the vowelic content may be determined by a voicing level, as indicated by, for example, vocoding parameter. Alternatively, the voicing level may be indicated by a spectral flatness of the speech signal. Expanding the formant regions may be performed to a degree, wherein the degree depends on a voicing level of a present frame of the processed speech signal. The expanding and restoring may be performed according to a non-linear frequency scale, which may be a critical band scale in accordance with human hearing.

Furthermore, the invention provides a speech filter comprised of an analysis portion having a set of filter coefficients determined by warped linear prediction analysis including pole displacement, the analysis portion having unit delay elements, and a synthesis portion having a set of filter coefficients determined by warped linear prediction synthesis including pole displacement, the synthesis portion having unit delay elements. The speech filter also includes a locally recurrent feedback element having a scaling value coupled to the unit delay elements of the analysis and synthesis portions thereby producing non-linear frequency resolution. The scaling value of the locally recurrent feedback element may be selected such that the non-linear frequency resolution corresponds to a critical band scale. The pole displacement of the synthesis and analysis portions is determined by voicing level analysis.

Furthermore, the invention provides a method of processing a speech signal comprising expanding formant regions of the speech signal on a critical band scale using a warped pole displacement filter.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of increasing the perceived loudness of a processed speech signal, the processed speech signal corresponding to a natural speech signal and having formant regions and non-formant regions and a natural energy level, the method comprising:

expanding the formant regions of the processed speech signal beyond a natural bandwidth by way of a warped linear prediction pole displacement model; and restoring an energy level of the processed speech signal to the natural energy level;

wherein restoring the energy level occurs upon expanding the formant regions in accordance with a critical band scale set by a single warping factor.

2. A method of increasing the perceived loudness as defined in claim 1, wherein the expanding and restoring are performed on a frame by frame basis of the processed speech signal using a warped finite impulse response (WFIR) and a warped infinite impulse response filter (WIIR) sharing a common warped delay line.

3. A method of increasing the perceived loudness as defined in claim 2, wherein the expanding and restoring are selectively performed on the processed speech signal when the frame contains substantial vowelic content.

4. A method of increasing the perceived loudness as defined in claim 3, wherein the vowelic content is determined by a voicing level.

5. A method of increasing the perceived loudness as defined in claim 4, wherein the voicing level is indicated by a spectral flatness of the speech signal.

6. A method of increasing the perceived loudness as defined in claim 2, wherein expanding the formant regions is performed to a degree, and wherein the degree depends on a voicing level of a present frame of the processed speech signal.

7. A method of increasing the perceived loudness as defined in claim 1, wherein expanding and restoring are performed according to a non-linear frequency scale.

8. A method of increasing the perceived loudness as defined in claim 7, wherein the non-linear scale is a critical band scale.

9. A speech filter, comprising, an analysis portion having a set of filter coefficients determined by warped linear prediction analysis including pole displacement, the analysis portion having unit delay elements;

a synthesis portion having a set of filter coefficients determined by warped linear prediction synthesis including pole displacement, the synthesis portion having unit delay elements; and a locally recurrent feedback element having a scaling value coupled to the unit delay elements of the analysis and synthesis portions thereby producing non-linear frequency resolution.

10. A speech filter as defined in claim 9, wherein the scaling value of the locally recurrent feedback element is selected such that the non-linear frequency resolution correspond to a critical band scale.

11. A speech filter as defined in claim 9, wherein the pole displacement of the synthesis and analysis portions is determined by voicing level analysis.

12. A method of processing a speech signal comprising:

expanding formant regions of the speech signal on a critical band scale using a warped pole displacement filter;

performing an auto-correlation analysis on portions of the speech signal to generate an auto-correlation sequence;

applying an all-pass transformation to the auto-correlation sequence to generate warped linear prediction coefficients;

performing a linear transform on the warped linear prediction coefficients to generate a sequence of bandwidth expanded warped linear prediction coefficients; and filtering the speech signal with the bandwidth expanded warped linear prediction coefficients to expand formant bandwidths of the speech signal on a critical band scale.

13. The method of claim 12, wherein the step of performing a linear transformation on the warped linear prediction coefficients includes binomial expansion.

14. The method of claim 13, wherein the binomial expansion includes a warping factor that increases higher frequency formants by more than it expands lower frequency formants in accordance with a critical band scale established by the warping factor.

15. The method of claim 12, wherein the step of filtering the speech signal uses a collapsed delay Direct Form II filter.

* * * * *